United States Patent
Ho et al.

(10) Patent No.: US 11,562,947 B2
(45) Date of Patent: Jan. 24, 2023

(54) SEMICONDUCTOR PACKAGE HAVING A CONDUCTIVE PAD WITH AN ANCHOR FLANGE

(71) Applicant: PANJIT INTERNATIONAL INC., Kaohsiung (TW)

(72) Inventors: Chung-Hsiung Ho, Kaohsiung (TW); Chi-Hsueh Li, Tainan (TW)

(73) Assignee: Panjit International Inc., Kaohsiung (TW)

( * ) Notice: Subject to any disclaimer, the term of this patent is extended or adjusted under 35 U.S.C. 154(b) by 0 days.

(21) Appl. No.: 16/920,908

(22) Filed: Jul. 6, 2020

(65) Prior Publication Data
US 2022/0005749 A1 Jan. 6, 2022

(51) Int. Cl.
| | | |
|---|---|---|
| H01L 23/485 | (2006.01) | |
| H01L 23/31 | (2006.01) | |
| H01L 23/00 | (2006.01) | |
| H01L 21/48 | (2006.01) | |
| H01L 21/56 | (2006.01) | |
| H01L 21/78 | (2006.01) | |

(52) U.S. Cl.
CPC ...... *H01L 23/4855* (2013.01); *H01L 21/4825* (2013.01); *H01L 21/561* (2013.01); *H01L 21/565* (2013.01); *H01L 21/568* (2013.01); *H01L 21/78* (2013.01); *H01L 23/3114* (2013.01); *H01L 24/40* (2013.01); *H01L 24/48* (2013.01); *H01L 2224/40175* (2013.01); *H01L 2224/48175* (2013.01)

(58) Field of Classification Search
CPC . H01L 21/4825; H01L 21/568; H01L 21/565; H01L 21/78; H01L 21/561; H01L 23/49503; H01L 23/49506; H01L 23/4951; H01L 23/49513; H01L 23/4855; H01L 24/24; H01L 23/49582; H01L 23/49824; H01L 23/3114; H01L 23/3107; H01L 24/40; H01L 24/48; H01L 24/82; H01L 24/85; H01L 24/96; H01L 21/56; H01L 21/4832; H01L 21/6835; H01L 23/49524; H01L 2924/18162; H01L 2224/24175
USPC ................ 257/762, 773, 775, 781, 784
See application file for complete search history.

(56) References Cited

U.S. PATENT DOCUMENTS

| | | | | |
|---|---|---|---|---|
| 7,537,965 | B2 * | 5/2009 | Oman ............... | H01L 21/4832 257/E21.51 |
| 10,529,655 | B2 * | 1/2020 | Rivera-Marty ... | H01L 23/49582 |
| 10,727,169 | B2 * | 7/2020 | Saito ............... | C23F 17/00 |

(Continued)

FOREIGN PATENT DOCUMENTS

| | | |
|---|---|---|
| TW | 201709456 A | 3/2017 |
| TW | I579991 B | 4/2017 |

*Primary Examiner* — Khiem D Nguyen
(74) *Attorney, Agent, or Firm* — Rosenberg, Klein & Lee

(57) ABSTRACT

A semiconductor package includes a molding compound, a chip and a conductive pad, wherein the chip is electrically connected to the conductive pad and both are encapsulated in the molding compound. An anchor flange is formed around a top surface of the conductive pad by over plating. When the conductive pad is embedded in the molding compound, the anchor flange engages the molding compound to prevent the conductive pad from separation. Bottoms of a chip and the conductive pad are exposed from the molding compound for electrically soldering to a circuit board.

7 Claims, 11 Drawing Sheets

(56) References Cited

U.S. PATENT DOCUMENTS

| | | | | |
|---|---|---|---|---|
| 2002/0180011 A1* | 12/2002 | Tanaka | ................... | H01L 24/97 257/676 |
| 2003/0194855 A1* | 10/2003 | Park | ..................... | H01L 23/488 438/614 |
| 2011/0267789 A1* | 11/2011 | Chew | ................. | H01L 21/4832 361/767 |
| 2012/0306065 A1* | 12/2012 | Bin Mohd Arshad | .. | H01L 24/97 257/676 |
| 2013/0040426 A1* | 2/2013 | Narita | ................... | H01L 21/78 257/E21.599 |
| 2013/0264710 A1* | 10/2013 | Osugi | ................ | H01L 27/0814 257/741 |
| 2014/0210091 A1* | 7/2014 | Ono | ........................ | H01L 21/50 257/762 |
| 2015/0194322 A1* | 7/2015 | Rogren | ................ | H01L 21/561 438/123 |
| 2016/0005680 A1* | 1/2016 | Israel | ................. | H01L 23/4334 257/675 |
| 2016/0379916 A1* | 12/2016 | Talledo | .............. | H01L 21/4842 257/676 |
| 2017/0162489 A1* | 6/2017 | Javier | ................ | H01L 23/3675 |
| 2017/0301612 A1* | 10/2017 | Haga | ...................... | H01L 24/73 |
| 2019/0006266 A1* | 1/2019 | Gomez | ............. | H01L 21/4832 |
| 2019/0067212 A1* | 2/2019 | Cadag | ................ | H01L 23/4952 |
| 2019/0096788 A1* | 3/2019 | Rodriguez | .......... | H01L 21/4825 |
| 2021/0050285 A1* | 2/2021 | Takao | .............. | H01L 23/49548 |

\* cited by examiner

SEMICONDUCTOR PACKAGE HAVING A CONDUCTIVE PAD WITH AN ANCHOR FLANGE

BACKGROUND OF THE INVENTION

1. Field of the Invention

The present invention relates to a semiconductor package and a method for manufacturing the same, particularly to a method by which the semiconductor package can be manufactured in low package height.

2. Description of the Related Art

Semiconductor devices can be manufactured in different package types. Minimizing the sizes of the semiconductor packages to implement high-density arrangement in a limited space is the main trend of the semiconductor packaging technique. For quad flat no-lead (QFN) packages or dual flat no-lead (DFN) packages, since soldering pads of those packages are formed on their bottoms instead of extending from sides of the packages, the QFN/DFN products have a lower height than packages of the past.

With reference to FIGS. 10A to 10E, a conventional QFN packaging process is illustrated. In FIG. 10A, a lead frame 200 is etched to form a die pad 201 and a plurality of intermediate leads 202. A chip 203 can be attached on the die pad 201 and electrically connected to the die pad 201. The lead frame 200 may be made of copper or other conductive materials.

With reference to FIG. 10B, the chip 203 is electrically connected to the plurality of the intermediate leads 202 through bonding wires 204.

With reference to FIG. 10C, a molding compound 18 is formed by a molding process to cover the chip 203, the die pad 201, the bonding wires 204 and the intermediate leads 202.

With reference to FIG. 10D, a bottom surface of the lead frame 200 is processed by a second etching process such that the intermediate leads 202 become the finished leads 206. Further, a partial bottom of the molding compound 205 is exposed.

With reference to FIG. 10E, an insulating layer 207 is provided to cover a portion of the finished leads 206.

The QFN package manufactured by the foregoing processes can be soldered to a circuit board (not shown) through the die pad 201 and the finished leads 206.

However, the semiconductor package still needs to be improved. Since the die pad 201 and the finished leads 206 are manufactured based on the lead frame 200, an uneven surface of the lead frame 200 may result in soldering problems. Further, the poor coverage of the insulation layer 207 on the finished leads 206 may cause problems of copper exposure.

SUMMARY OF THE INVENTION

An objective of the present disclosure is to provide a semiconductor package. The semiconductor package comprises:
a molding compound having a top surface and a bottom surface;
a chip encapsulated in the molding compound and having a bottom on which a solder layer is formed, the solder layer being exposed from the bottom surface of the molding compound; and
a conductive pad encapsulated in the molding compound and electrically connected to the chip and having
a bottom exposed from the bottom surface of the molding compound;
a perpendicular side surface; and
an anchor flange formed around a top surface of the conductive pad to engage the molding compound.

Another objective of the present disclosure is to provide a manufacturing method of a semiconductor package. The method comprises:
defining a die-bonding region on a carrier and forming a conductive pad on the carrier, wherein the conductive pad has a perpendicular side surface and an anchor flange formed by over plating and around a top surface of the conductive pad;
bonding a chip on the die-bonding region of the carrier;
electrically connecting the chip to the conductive pad;
forming a molding compound to encapsulate the chip and the conductive pad; and
etching the carrier to expose bottoms of the chip and the conductive pad from a bottom of the molding compound.

Other objectives, advantages and novel features of the invention will become more apparent from the following detailed description when taken in conjunction with the accompanying drawings.

DETAILED DESCRIPTION OF THE INVENTION

The present disclosure relates to a semiconductor package such as a quad flat no-lead (QFN) package or a dual flat no-lead (DFN) package. In the following description, a diode package is taken as an example of the semiconductor package for purpose of describing the present disclosure.

Figure 1A:
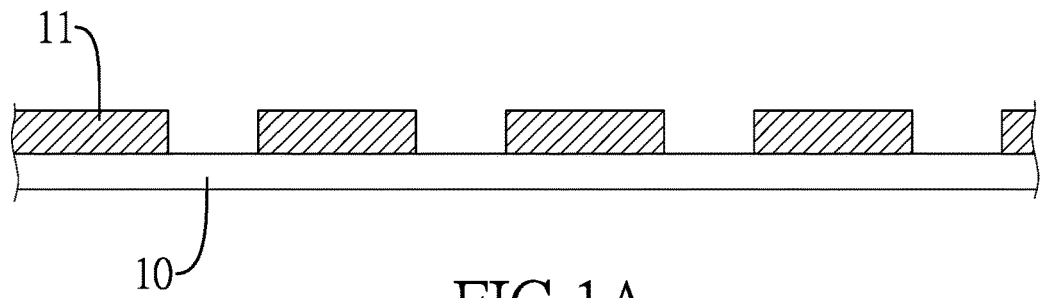
FIGS. 1A to 1C are cross-sectional views showing a process of manufacturing conductive pads on a substrate.
Figure 1B:
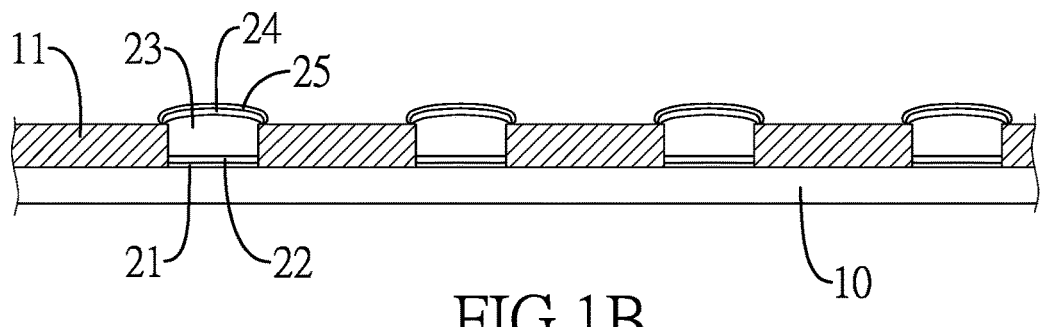
Figure 1C:
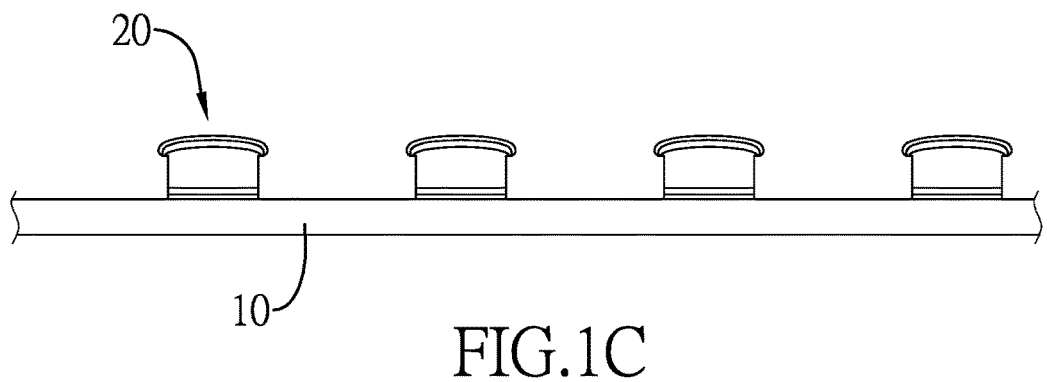

With reference to FIGS. 1A to 1C, a manufacturing process of conductive pads on a carrier are shown. In FIG. 1A, a photomask 11 made through a photolithography process is applied on a carrier 10. The carrier 10 may be a copper foil, a strip, a wafer, a panel, etc. The patterns of the photomask 11 are determined based on product types. For example, areas covered by the photomask 11 on the carrier 10 are defined as die-bonding regions while other areas uncovered by the photomask 11 are defined as conductive pad regions. An electroplating process is performed to form a composite conductive layer on the conductive pad regions. In the embodiment of FIG. 1B, the composite conductive layer is formed by sequentially plating an *aurum* layer (Au) 21, a nickel layer (Ni) 22, a copper layer (Cu) 23, a nickel layer (Ni) 24 and an *aurum* layer (Au) 25 on the carrier 10. However, the electroplating materials and sequence may be varied by demands and are not limited to the examples listed above. In the present disclosure, by controlling the electroplating time of the copper layer 23, the conductive pad regions on the carrier 10 are deliberately over-plated so that the copper layer 23 is slightly above the top surface of the photomask 11. As shown in FIG. 1B, the top surface of the copper layer 23 is above the top surface of the photomask 11. The nickel layer 24 and the *aurum* layer 25 are subsequently plated on the copper layer 23. After the electroplating process is completed, the photomask 11 is removed from the carrier 10. The composite conductive layer remaining on the carrier 10 constitutes the conductive pad 20.

Figure 2:
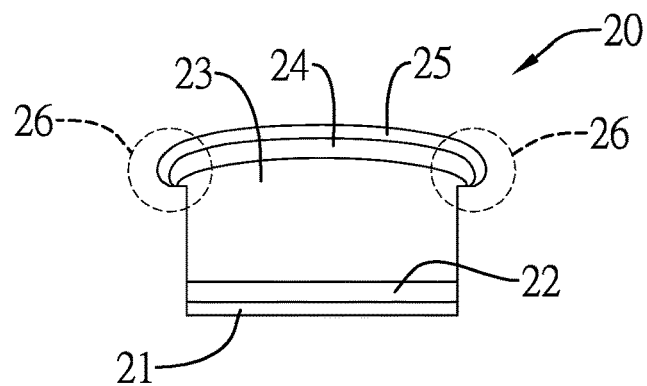
FIG. 2 is a cross-sectional view of the conductive pad.

As shown in FIG. 2, because an over plating operation is deliberately performed on the carrier 10, the conductive pad 20 has the mushroom-shaped appearance with a perpendicular side surface and an anchor flange 26 around the top surface of the conductive pad 20.

The carrier 10 with the conductive pads 20 formed thereon may further be processed by subsequent packaging processes as shown in FIGS. 3A to 3F.

Figure 3A:
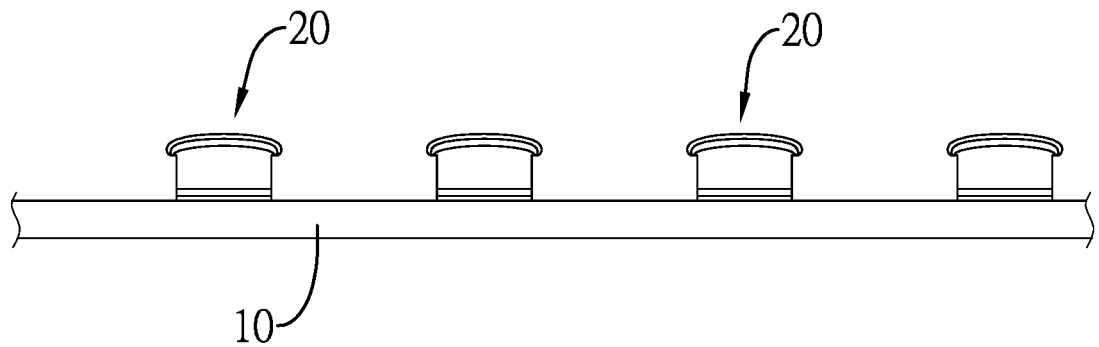
FIGS. 3A to 3F are cross-sectional views of packaging processes of the present disclosure, wherein a wire-bonding process is used for electrical connection.
Figure 3B:
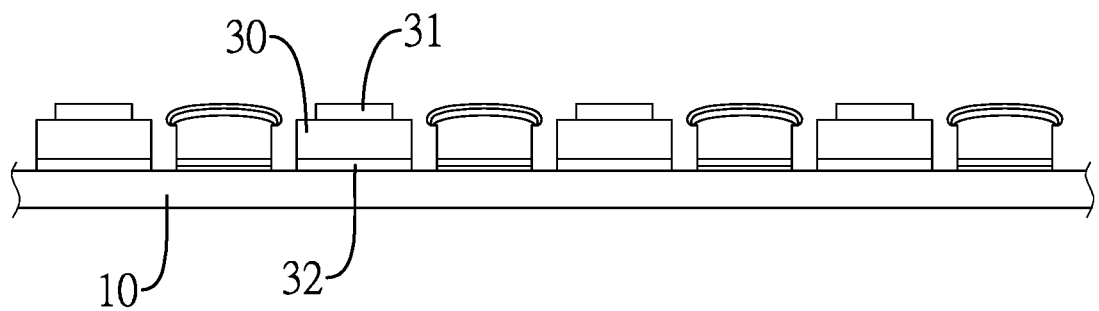

With reference to FIG. 3B showing the die-bonding process, a chip 30 is bonded on the die-bonding region of the carrier 10. The height of the chip 30 is approximately equal to the height of the conductive pad 20 so that the top of chip 30 is substantially co-planar with the top of the conductive pad 20. The top surface of the chip 30 is provided with at least one connecting pad 31 and the bottom of the chip 30 may be electroplated by metal material in advance to form a solder layer 32.

Figure 3C:
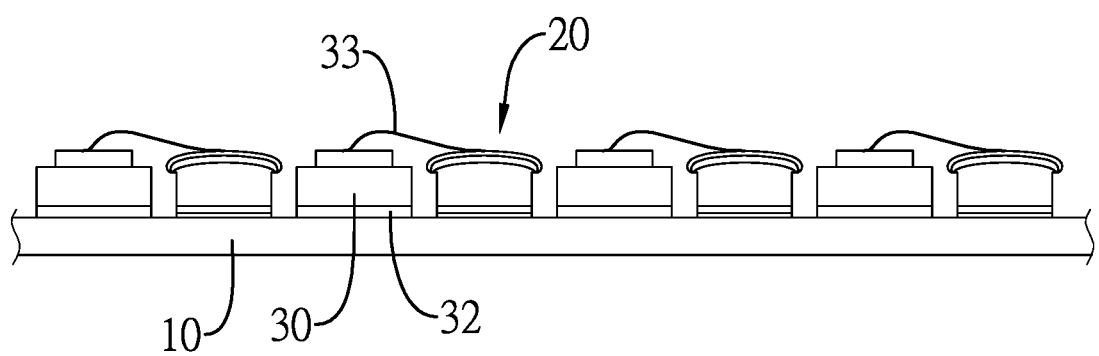

With reference to FIG. 3C, after the chip 30 is bonded on the carrier 10, the wire-bonding process is performed to connect the connecting pad 31 of the chip 30 to the respective conductive pad 20 via a wire 33.

Figure 3D:
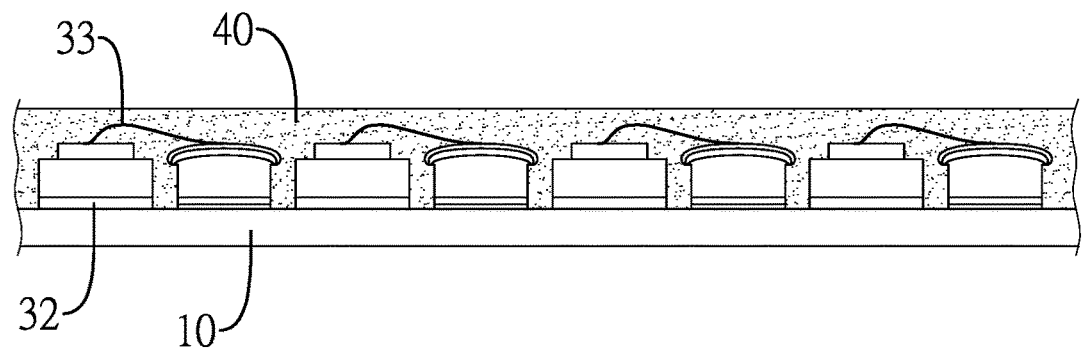

With reference to FIG. 3D, after the wire-bonding process, the molding process is performed to encapsulate the chip 30 and the conductive pad 20 with a molding compound 40.

Figure 3E:
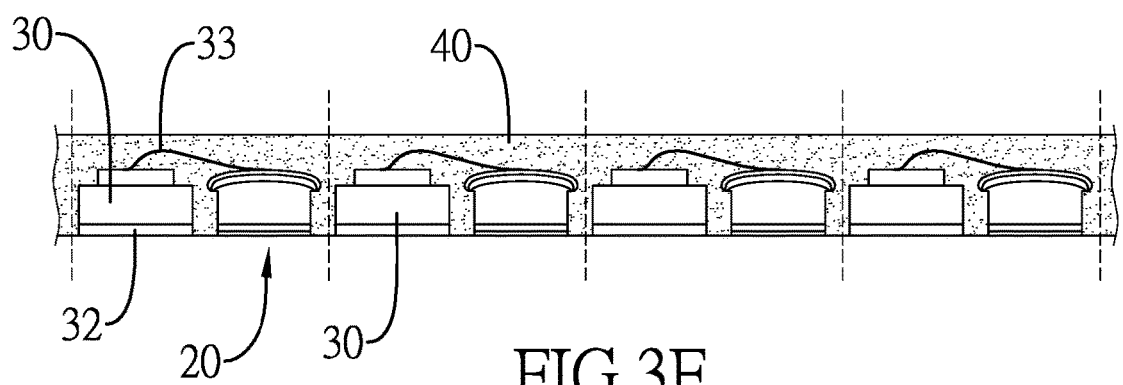

With reference to FIG. 3E, after the molding process, the carrier 10 is removed by etching such that the solder layer 32 of the chip 30 and the bottom of the conductive pad 20 are exposed. A sawing process is then performed to cut the molding compound 40 along the paths as indicated by the broken lines on FIG. 3E.

Figure 3F:
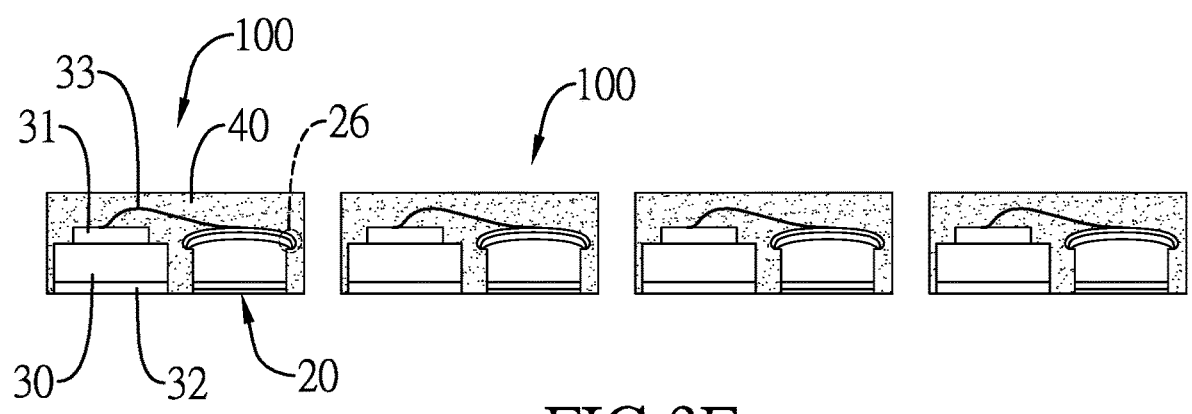

With reference to FIG. 3F, after the sawing process, a plurality of individual semiconductor packages 100 is manufactured. For each of the semiconductor packages 100, the anchor flange 26 of the conductive pad 20 engages the molding compound 40 to enhance interlock between the conductive pad 20 and the molding compound 40 and prevent the conductive pad 20 from separation.

Figure 4A:
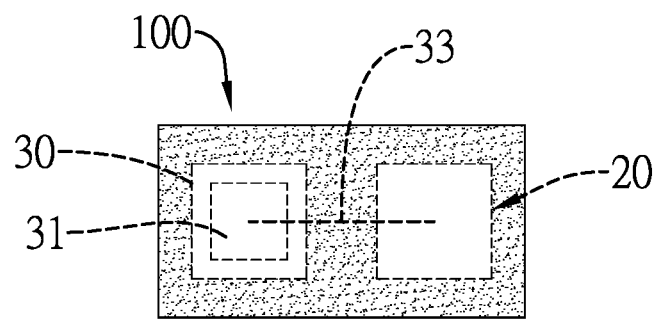
FIG. 4A is a top view of a dual lead semiconductor package.
Figure 4B:
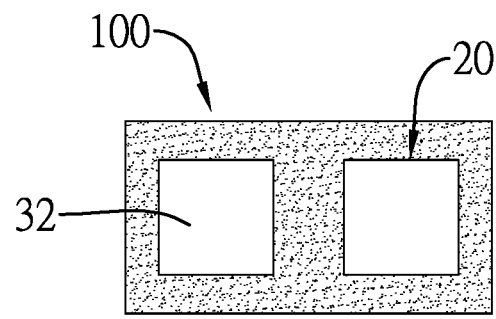
FIG. 4B is a bottom view of the dual lead semiconductor package of FIG. 4A.

FIG. 4A shows a top view of the semiconductor package 100, wherein the chip 30 and the conductive pad 20 are similar in size. FIG. 4B shows a bottom view of the semiconductor package 100. In this embodiment, the semiconductor package 100 is a dual-lead element such as a diode having an anode and a cathode. The solder layer 32 of the chip 30 and the bottom of the conductive pad 20 function as two solder leads of the dual-lead element for electrically mounting on a circuit board. In the example of FIGS. 4A and 4B, the size of the solder layer 32 is similar to the size of the bottom of the conductive pad 20.

Figure 5:
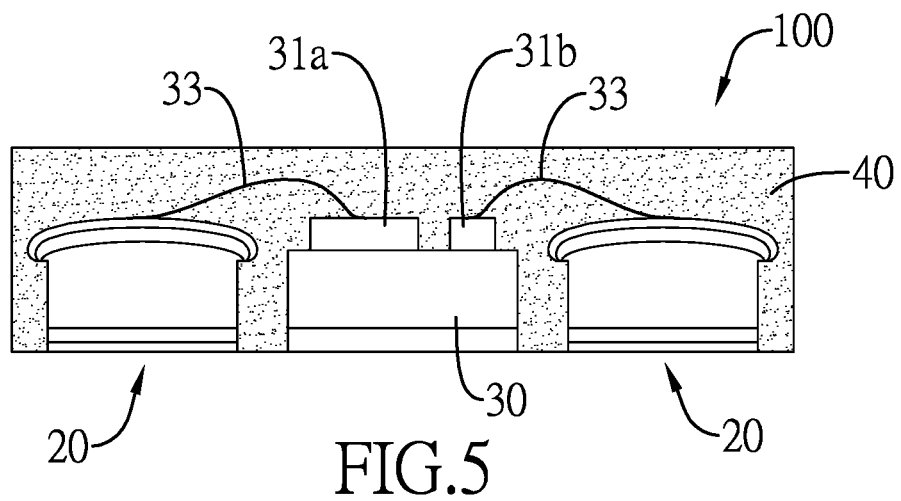
FIG. 5 is a cross-sectional view of a three-lead semiconductor package with bonding wires.

With reference to FIG. 5, the processes of the present disclosure discussed above may be applied to manufacture a three-lead or multi-lead semiconductor package 100. During the wire-bonding process, different connecting pads 31a, 31b on the chip 30 are connected to respective conductive pads 20 via multiple wires 33. The bottoms of the conductive pads 20 and the chip 30 constitute a plurality of solder leads of the multi-lead semiconductor package 100.

In another embodiment, the electrical connection between the chip 30 and the conductive pad 20 is implemented by a redistribution-layer (RDL) process shown in FIGS. 6A to 6G instead of the wire-bonding process.

Figure 6A:
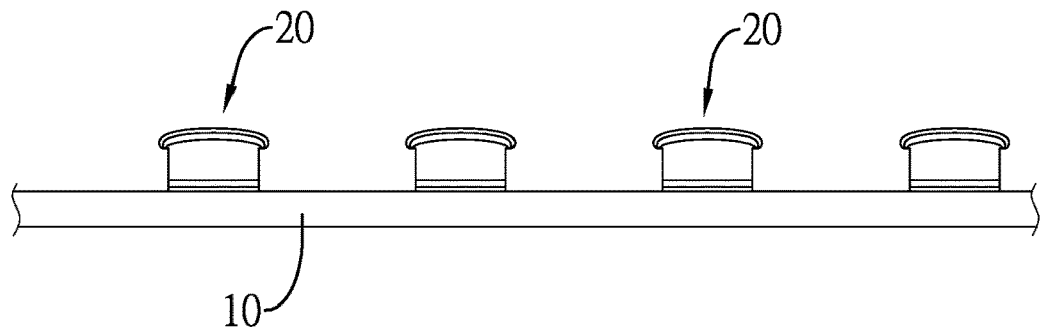
FIGS. 6A to 6G are cross-sectional views of packaging processes of the present disclosure, wherein a redistribution process is used for electrical connection.
Figure 6B:
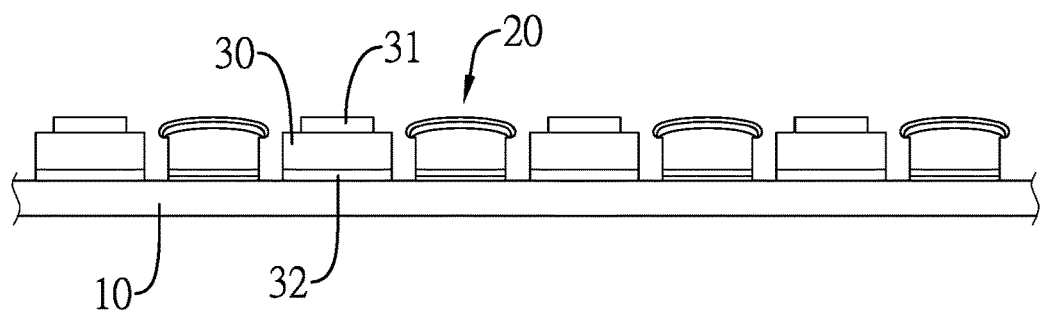

With reference to FIGS. 6A and 6B, because the processes of forming the conductive pad 20 and die-bonding are the same as shown in FIGS. 3A and 3B, the detailed descriptions for FIGS. 6A and 6B are omitted to avoid redundant description.

Figure 6C:
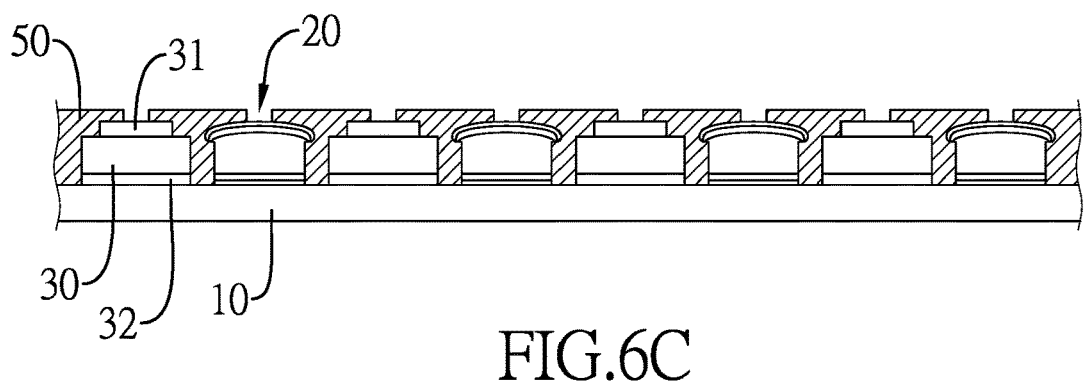

With reference to FIG. 6C, after the die-bonding process, a dielectric layer 50 is coated on the carrier 10 and etched through the photolithography process to define a wire pattern, wherein parts of the connecting pad 31 of the chip 30 and the conductive pad 20 are exposed from the wire pattern.

Figure 6D:
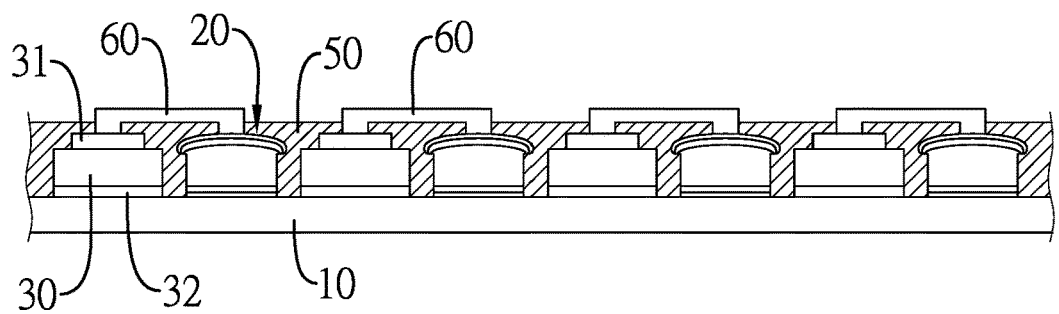

With reference to FIG. 6D, an electroplating process is performed to form a redistribution layer (RDL) as connection circuits 60 for connecting the connecting pad 31 of the chip 30 to the conductive pad 20. In one embodiment, the connection circuits 60 are made of *aurum*.

Figure 6E:
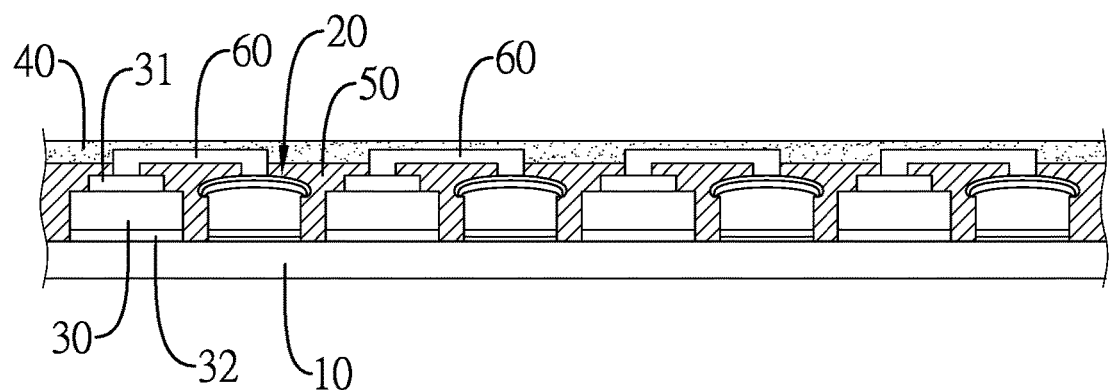
Figure 6F:
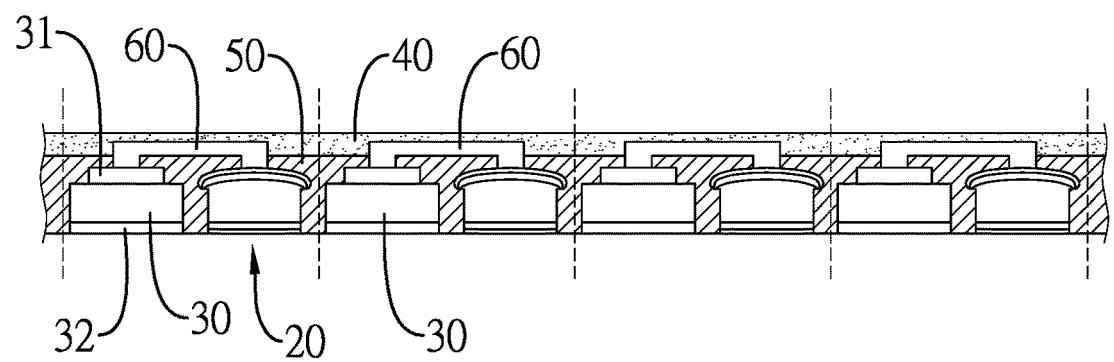
Figure 6G:
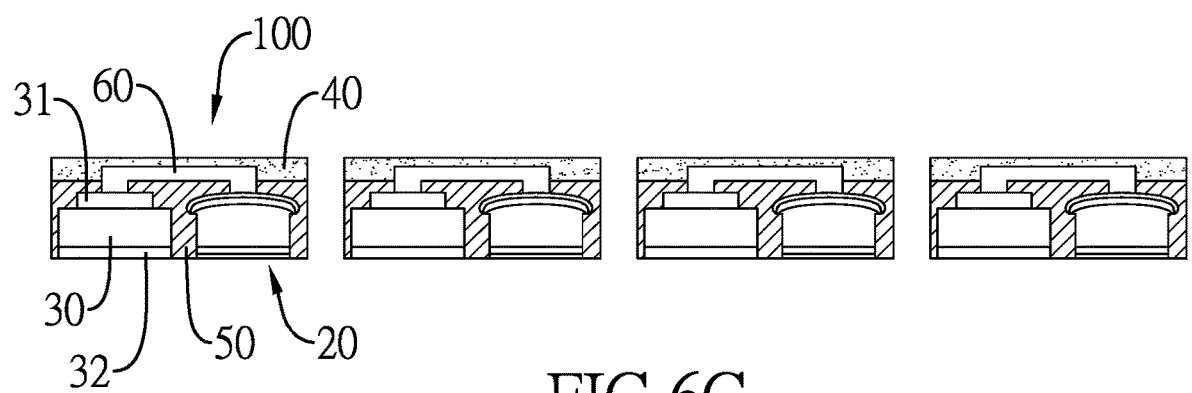

With reference to FIGS. 6E to 6G, after the redistribution layer is formed, subsequent molding, carrier 10 etching and sawing processes similar to steps of FIGS. 3D to 3F are performed to complete the semiconductor packages 100.

Figure 7:
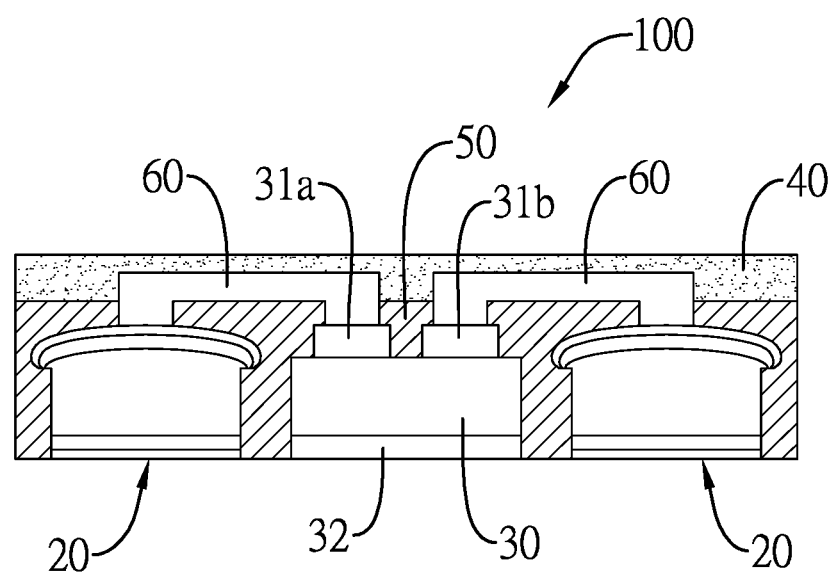
FIG. 7 is a cross-sectional view of a three-lead semiconductor package with a redistribution layer.

As shown in FIG. 7, the connection circuits 60 made by the redistribution layer may be used to fabricate the three-lead or multi-lead semiconductor package 100. Different connecting pads 31a, 31b on the chip 30 are connected to respective conductive pads 20 via the connection circuits 60. The bottoms of the conductive pads 20 and the chip s30 constitute a plurality of solder leads of the semiconductor package 100.

With reference to FIGS. 8A to 8D, for a semiconductor package having a specific appearance request, the soldering pads of the semiconductor package should be formed in a specific size and shape. In order to meet the requirement, die pads 36 with needed size and shape may be pre-manufactured on the carrier 10 for connecting the chip 30.

Figure 8A:
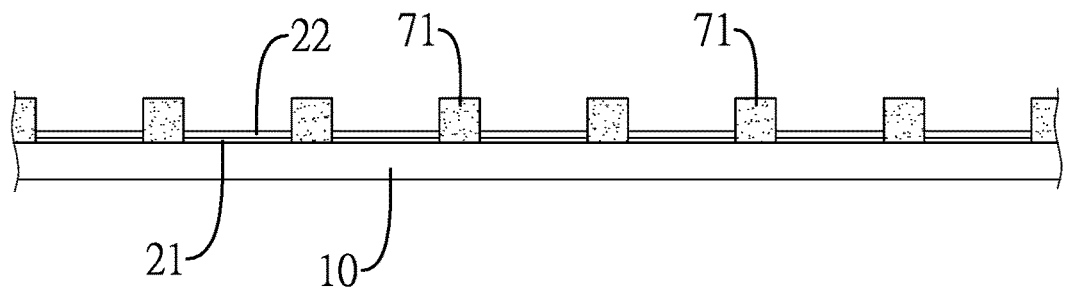
FIG. 8A to 8D are cross-sectional views showing a process of manufacturing conductive pads on a substrate in accordance with another embodiment of the present invention.

With reference to FIG. 8A, a first photomask 71 made through photolithography is applied on a carrier 10 to define patterns of the conductive pads 20 as well as die pads 36. The surface of the carrier 10 uncovered by the first photomask 71 is plated to form an *aurum* layer 21 (Au) and a nickel layer 22 (Ni) sequentially.

Figure 8B:
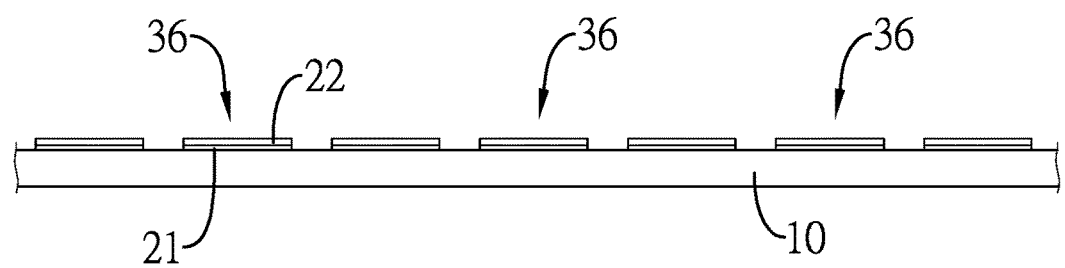

With reference to FIG. 8B, after removing the first photomask 71, the *aurum* layer (Au) 21 and the nickel layer (Ni) 22 corresponding to patterns of the chips 30 form a die pad 36.

Figure 8C:
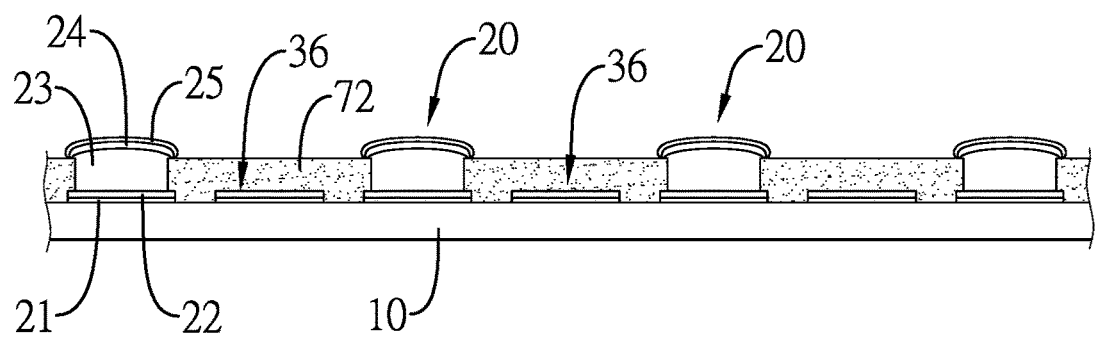

With reference to FIG. 8C, a second photomask 72 made through photolithography is applied on the carrier 10 to cover the die pads 36. The regions exposed from the second photomask 72 are then plated to form a copper layer (Cu) 23, a nickel layer (Ni) 24 and an *aurum* layer (Au) 25 sequentially. The multi-layer structure composed of the *aurum* layer (Au) 21, the nickel layer (Ni) 22, the copper layer (Cu) 23, the nickel layer (Ni) 24 and the *aurum* layer (Au) 25 forms a conductive pad 20.

Figure 8D:
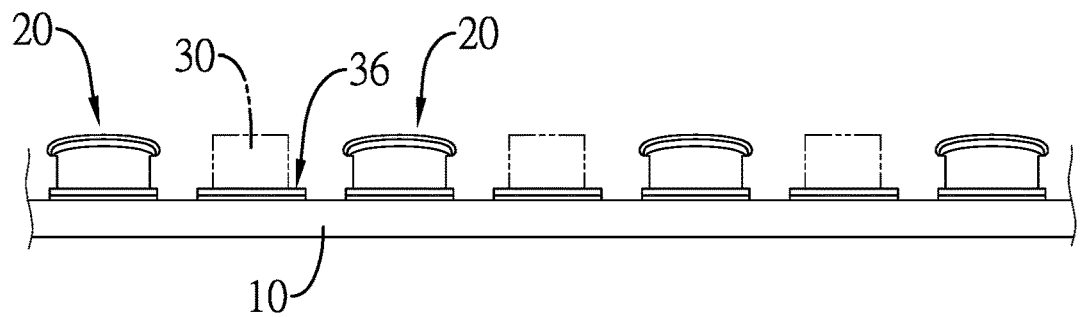

With reference to FIG. 8D, after the conductive pad 20 is formed, the second photomask 72 is removed from the carrier 10, wherein the conductive pads 20 as well as the die pads 36 remain on the carrier 10. The chip 30 can be bonded on the die pad 36 and electrically connected to the neighboring conductive pads 20 through wire bonding or RDL processes.

Figure 9A:
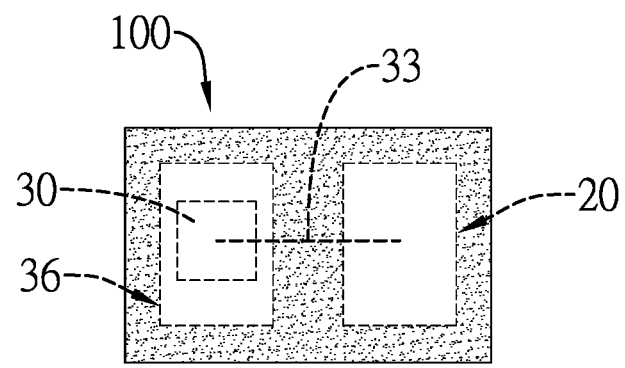
FIG. 9A is a top view of a dual lead semiconductor package manufactured based on a carrier formed by processes of FIGS. 8A to 8D.
Figure 9B:
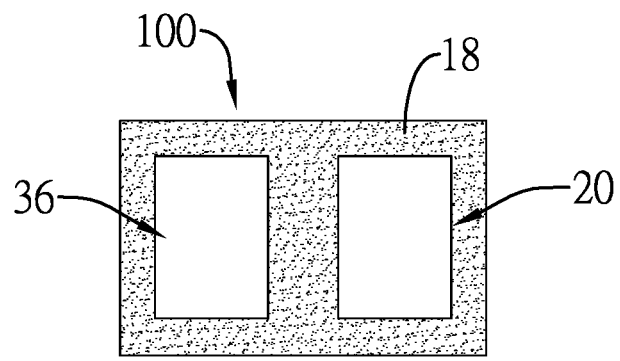
FIG. 9B is a bottom view of the dual lead semiconductor of FIG. 9A.
Figure 10A:
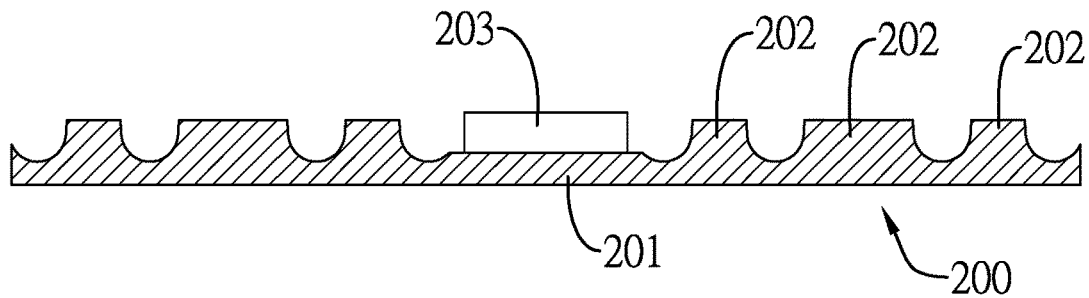
FIGS. 10A to 10E are cross-sectional views showing a conventional method of manufacturing QFP semiconductor packages.
Figure 10B:
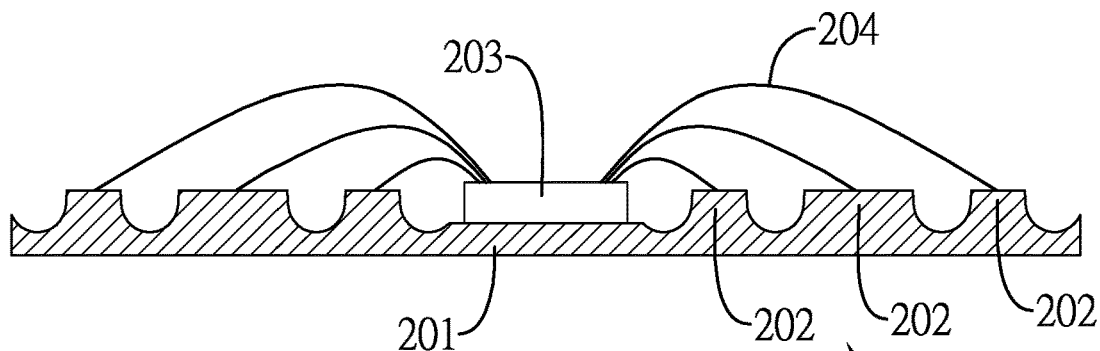
Figure 10C:
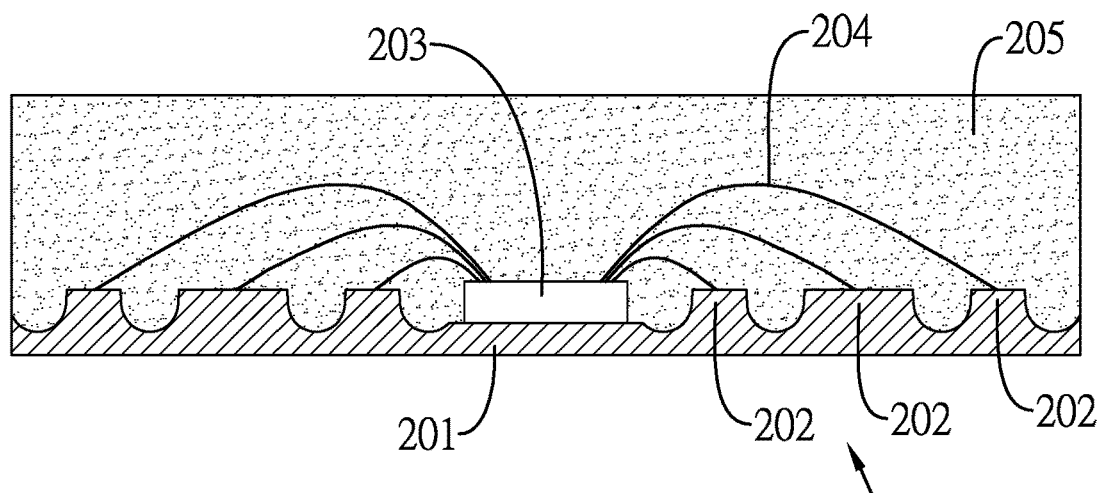
Figure 10D:
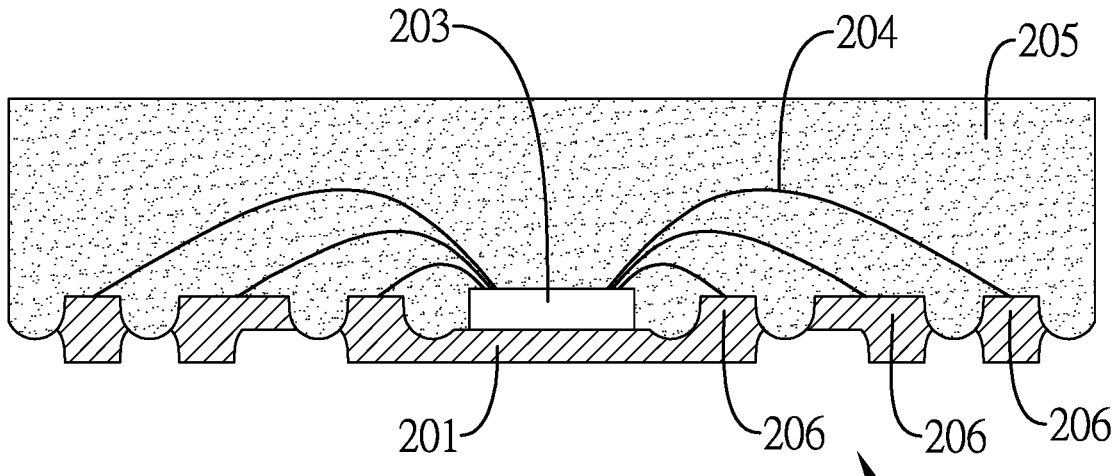
Figure 10E:
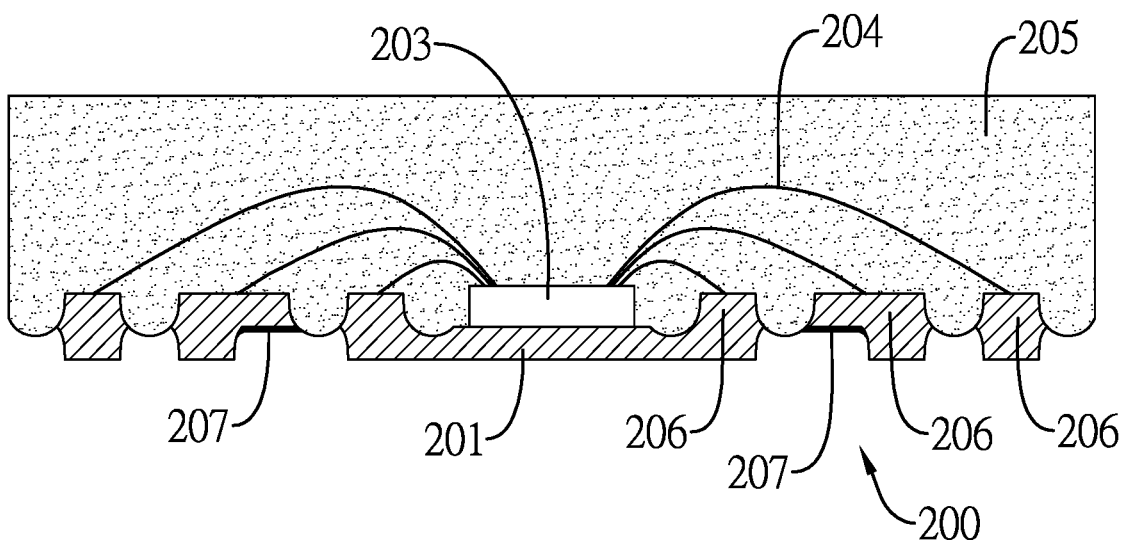

With reference to FIGS. 9A and 9B, when the carrier 10 manufactured through the steps of 8A to 8D is applied to packaging processes, since the die pad 36 for electrically connecting the chip 30 is exposed from the bottom of the molding compound 18, the die pad 36 functions as the plated solder layer 32 discussed in FIG. 4B. Therefore, the distribution, sizes or shapes of solder pads of the semiconductor package 100 are substantially determined by the die pads 36 and the conductive pads 20.

In short, the semiconductor package and manufacturing method thereof in accordance with present disclosure at least have the following features:

1. Because the semiconductor package is not manufactured based on any lead frame used, the problems resulted from the lead frame such as copper exposure and uneven surface of the lead frame are avoided.

2. The thickness of the semiconductor package is reduced as much as possible.

3. By simply controlling the electroplating process, the conductive pad is manufactured to form an anchor flange for engaging the molding compound. As a result, the separation of the conductive pad and the molding compound can be avoided.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A semiconductor package comprising:
    a molding compound having a top surface and a bottom surface;
    a chip encapsulated in the molding compound and having a bottom surface on which a single-layered flat solder layer is comprehensively and directly formed, the single-layered flat solder layer being exposed from the bottom surface of the molding compound, being equal in area to the bottom surface of the chip and functioning as a solder lead of the semiconductor package for electrically and directly mounted on a circuit board; and
    a conductive pad encapsulated in the molding compound and electrically connected to the chip and having
    a bottom exposed from the bottom surface of the molding compound;
    a perpendicular side surface; and
    an anchor flange formed around a top surface of the conductive pad to engage the molding compound;
    wherein the conductive pad differs from the single-layered flat solder layer in shape and is thicker than the single-layered flat solder layer.

2. The semiconductor package as claimed in claim 1, wherein the top surface of the conductive pad is substantially co-planar with a top surface of the chip.

3. The semiconductor package as claimed in claim 1, wherein the conductive pad is formed by multiple layers of metal material electroplated on a carrier.

4. The semiconductor package as claimed in claim 3, wherein the metal material comprises *aurum*, nickel, copper or a combination thereof; and
    the metal material at the bottom of the conductive pad is exposed from the bottom surface of the molding compound.

5. The semiconductor package as claimed in claim 3, wherein the chip is electrically connected to the top surface of the conductive pad via a redistribution layer.

6. The semiconductor package as claimed in claim 1, wherein the single-layered flat solder layer is formed by electroplating.

7. The semiconductor package as claimed in claim 1, wherein the single-layered flat solder layer of the chip is a die pad on which the chip is bonded.

\* \* \* \* \*